METHOD FOR MAKING HIGH TEMPERATURE LOW OHMIC CONTACT TO SILICON

Original Filed Dec. 15, 1970

3,794,516

METHOD FOR MAKING HIGH TEMPERATURE LOW OHMIC CONTACT TO SILICON

William E. Engeler, 88 St. Stephens Lane W., Scotia, N.Y. 12302, and Linus F. Cordes, 1145 Godfrey Lane, Schenectady, N.Y. 12309

Original application Dec. 15, 1970, Ser. No. 98,266, now Patent No. 3,714,520. Divided and this application Dec. 17, 1971, Ser. No. 209,400
Int. Cl. B44d *1/14, 1/18*
U.S. Cl. 117—217 3 Claims

ABSTRACT OF THE DISCLOSURE

A high temperature low ohmic electrical contact is made to a silicon body by forming a very thin layer of silicon carbide over the silicon body and then forming a metallic layer, such as a refractory metal, over the silicon carbide to form a high quality low ohmic contact to the surface of the silicon body.

This is a division of application Ser. No. 98,266, filed Dec. 15, 1970, now Pat. No. 3,714,520.

BACKGROUND OF THE INVENTION

The present invention relates to semiconductor devices and more particularly to a low electrical resistance connection to a semiconductor body and a method for making the same.

The fabrication of semiconductor devices in discrete form and in integrated circuit form necessarily require the formation of electrical contacts to specific portions of a semiconductor wafer. Additionally, integrated circuits employ numerous interconnections between circuit elements on the same semiconductor chip. A widely used method for making ohmic contacts and interconnections on an oxide-coated semiconductor wafer includes etching the desired contact area in the oxide layer to the semiconductor surface and then selectively depositing aluminum on the oxide surface to form the interconnection as well as forming the ohmic contact to the semiconductor. This type of contact-interconnection is not completely satisfactory for many applications. For example, aluminum, which is a very reactive metal, reacts with silicon dioxide and penetrates through the oxide layer to form a contact with the semiconductor surface. Additional reactions with other portions of the oxide layer, however, increase the possibility of electrical short circuits. Also, at temperatures approaching the eutectic temperature of aluminum and silicon, the diffusion of aluminum into the silicon is appreciable, thereby altering the resistivity and possibly even the conductivity type of the semiconductor material.

The use of aluminum contacts and interconnections is therefore limited to at least those applications where subsequent semiconductor processing is below approximately 600° C. This limitation poses a severe restriction on subsequent processing steps, such as passivation, multilevel interconnections and wire bonding. The use of higher melting point metals in place of aluminum has not been entirely satisfactory. A particularly troublesome problem is the formation of an oxide-free surface before the metal contact or interconnection is formed to the semiconductor. Even very thin films, i.e., 10–20 A.U. of silicon dioxide prevent the formation of low ohmic contacts to silicon. Accordingly, the formation of good electrical and mechanical bonds to silicon are extremely difficult.

SUMMARY OF THE INVENTION

A primary object of this invention, therefore, is to provide a low ohmic contact to silicon.

Another object of this invention is to provide a method for forming high temperature resistant contacts to silicon.

It is yet another object of this invention to provide high temperature resistant low ohmic contacts and interconnections to a silicon surface.

Briefly, and in accord with one embodiment of our invention, we provide a very thin layer of silicon carbide of the order of 10's of angstroms over an oxide-free silicon surface with a metallic layer formed thereover as a high quality ohmic contact between the metallic layer and the silicon surface. The thin film of silicon carbide prevents the oxidation of the silicon and permits the formation of a low ohmic, high quality, high temperature resistant electrical contact with the silicon surface.

BRIEF DESCRIPTION OF THE DRAWING

These and other objects, features and advantages of our invention will become more apparent from the following detailed description taken in connection with the accompanying drawing in which.

DETAILED DESCRIPTION

Figure 1:
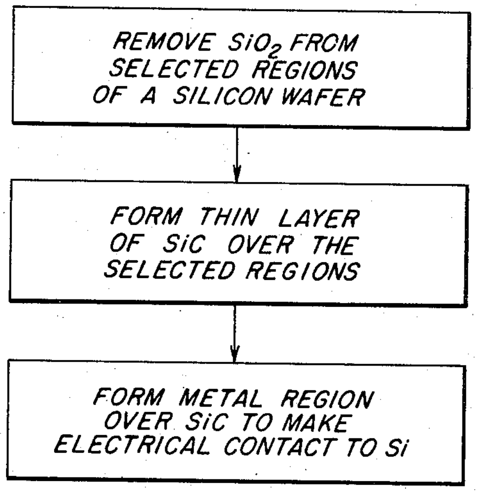
FIG. 1 is a flow chart showing steps in the method of our invention.

A method for forming high temperature low ohmic electrical contacts to silicon is set forth in FIG. 1. Basically, the method comprises removing any silicon dioxide from at least selected regions of the silicon wafer so that an oxide-free surface is provided. This may be advantageously achieved by placing the silicon wafer into a chamber, evacuating the chamber to a vacuum pressure of approximately $10^{-7}$ torr. and raising the temperature of the wafer to approximately 900° C. After approximately one hour at this elevated temperature, any thin layers of silicon dioxide remaining on the wafer as a result of oxidation of the silicon are removed. The oxide-free surface is then covered with a thin layer of silicon carbide. This may be accomplished, for example, by the introduction of methane, ethane or numerous other carbon containing gases into the evacuated chamber under a pressure of approximately $10^{-6}$ to $10^{-4}$ torr. After a period of one to two minutes at a temperature of 900° C., silicon carbide forms on the oxide-free surface of the silicon to a thickness of approximately 15 A.U. The flow of the carbon containing gas (e.g., methane) is stopped and the wafer is permitted to cool to room temperature. The silicon carbide layer thus formed, prevents oxidation from occurring in those regions covered by the silicon carbide and hence the wafer can be handled in air without fear of oxidation.

The silicon carbide covered wafer is then provided with a metallic layer to form the electrical contact to the silicon wafer. Various metals may be utilized for this purpose. For example, molybdenum, tungsten, chromium, platinum, nickel, palladium, titanium, silicon, or any of the various alloys formed by various combinations of these metals and useful in the semiconductor technology may be advantageously employed in practising our invention. Lower melting point metals such as aluminum, gold and silver may also be advantageously employed where subsequent processing steps do not exceed the melting points of the selected materials. Therefore, in accord with one of the novel features of our invention, the use of silicon carbide as an intermediate layer between the silicon and the metallic layer permits the use of many metals which might otherwise be unsuitable to the semiconductor technology.

Another characteristic feature of our invention is the thickness of the silicon carbide layer which is preferably maintained at a thickness less than approximately 50 A.U. Those skilled in the art can readily appreciate that silicon carbide is primarily a wide bandgap semi-conducting material and hence thicknesses greater than approximately 50 A.U. generally produce undesirably high resistivity contacts to the silicon substrate. On the other hand, silicon carbide thicknesses of less than approximately 10 A.U. are not sufficiently uniform and continuous to prevent the formation of silicon dioxide and are also undesirable. Therefore, in practising our invention, an operable range of silicon carbide thicknesses of between approximately 10 and 50 A.U. is desirable. Thicknesses of between 15 and 20 A.U. produce particularly good results with metallic films of molybdenum, tungsten and aluminum, for example.

The various metals described above as being suitable for practising our invention may be formed by various methods known in the art. For example, metallic films may be prepared by chemical and electro-chemical deposition, cathodic sputtering and vacuum evaporation, if desired. An electrodeless chemical method is particularly suited for the deposition of nickel, platinum, chromium, aluminum and magnesium. Vacuum evaporation is also suitable for aluminum and gold films. Cathodic sputtering may be employed for metallic films of molybdenum, tantalum, tungsten, and other refractory metals.

Figure 2:
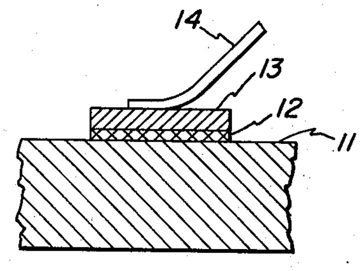
FIG. 2 is a schematic illustration of a completed contact structure in accord with one embodiment of our invention.

FIG. 2 illustrates an electrical contact to a silicon wafer 11 through a thin layer 12 of silicon carbide and a metallic layer 13 such as molybdenum, tungsten, or any of the other numerous metallic layers described above. An electrical wire 14 is attached to the metallic layer 13, by suitable means, such as thermal compression bonding or a suitable solder for the metals involved. Although illustrated as a single contact, those skilled in the art can readily appreciate that numerous contacts can be made at substantially the same time to various other points of the semiconductor wafer, as is done in the fabrication of integrated circuits.

Figure 3:
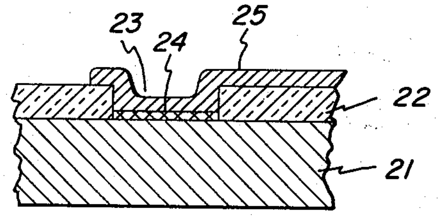
FIG. 3 is a cross-sectional schematic illustration of another completed electrical contact in accord with another embodiment of invention.

FIG. 3 illustrates yet another embodiment of our invention wherein a semiconductor wafer of silicon is provided with a silicon dioxide layer 22 with an aperture 23 formed therein to the surface of the semiconductor wafer 21. The silicon dioxide layer 22 is sufficiently thick so that when the oxide is removed from the apertured area, a substantial portion of the silicon dioxide layer 22 still remains. In accord with this embodiment of our invention, the formation of a silicon carbide film 24 occurs only in the oxide-free areas of the semiconductor wafer. This is a result of the silicon dioxide layer 22 functioning as a mask to the growth of silicon carbide. After forming a thin film of silicon carbide, a metallic layer 25 is formed over the surface of the wafer and may be selectively etched, to produce any desired pattern for interconnection purposes, for example.

Figure 4:
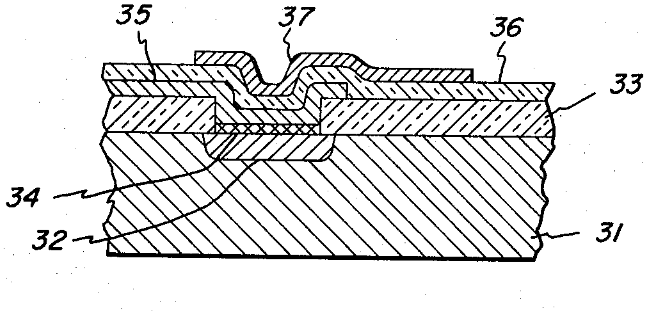
FIG. 4 is a cross-sectional schematic illustration of a multi-level interconnection pattern in accord with yet another embodiment of our invention.

FIG. 4 illustrates yet another embodiment of our invention wherein a semiconductor wafer 31 of n-type silicon, for example, includes a p-type diffused region 32 formed through the apertured silicon dioxide layer 33 prior to the formation of a silicon carbide layer 34. A low ohmic contact is made to the diffused region 32 by depositing a metallic layer 35 over the wafer and selectively etching the metallic film to form the desired pattern therein. Multilevel interconnections can be advantageously formd in accord with this embodiment of our invention by forming an insulating film 36 over the wafer and then depositing yet another metallic layer 37 to provide another level for interconnections. Still additional insulating layers and conducting layers may be formed over those illustrated, if desired, to provide still additional levels of interconnection. Those skilled in the art can readily appreciate that these additional layers of metallization are made possible only because the metal layer 35 is a sufficiently high melting point material that subsequent high temperature processing steps can be performed without deleterious effects on the low ohmic contact to the diffused region 32.

Those skilled in the art can readily appreciate that we have disclosed a new and novel high temperature resistant low ohmic contact to silicon and a method for making the same which is compatible with the semiconductor technology. While the invention has been set forth herein with respect to certain specific embodiments and illustrations thereof, many modifications and changes will readily occur to those skilled in the art. Accordingly, by the appended claims, we intend to cover all such modifications and changes as fall within the true spirit and scope of our invention.

What we claim as new and desire to secure by Letters Patent of the United States is:

1. A method for forming a low ohmic contact to a silicon body comprising the steps of:
- forming an oxide-free region on a silicon body;
- forming a thin layer of silicon carbide over the oxide-free region, said layer having a thickness of between approximately 10 and 50 angstroms; and
- forming a metal contact over said layer of silicon carbide to make a low ohmic contact to said silicon body.

2. The method of claim 1 wherein said layer of silicon carbide is formed by growing from the surface of the silicon body in the presence of a carbon-containing gas.

3. The method of claim 1 further comprising the steps of forming an insulating layer over said metallic contact; and forming a metallic layer over said insulating layer.

References Cited

UNITED STATES PATENTS 3,389,022 6/1968 Kravitz ---------- 117—106 C

CAMERON K. WEIFFENBACH, Primary Examiner

U.S. Cl. X.R.

117—106 C, 118, 212; 317—234 M